United States Patent [19]
Hain et al.

[11] Patent Number: 5,844,302
[45] Date of Patent: Dec. 1, 1998

[54] INTEGRATED SEMICONDUCTOR CIRCUIT WITH CAPACITORS OF PRECISELY DEFINED CAPACITANCE AND PROCESS FOR PRODUCING THE CIRCUIT

[75] Inventors: Manfred Hain, Vaterstetten; Elisabeth Fischer, Frasdorf, both of Germany

[73] Assignee: Siemens Aktiengesellschaft, Munich, Germany

[21] Appl. No.: 847,867

[22] Filed: Apr. 28, 1997

Related U.S. Application Data

[63] Continuation of Ser. No. 363,284, Dec. 22, 1994, abandoned.

[30] Foreign Application Priority Data

Dec. 22, 1993 [DE] Germany .......................... 43 43 983.7

[51] Int. Cl.$^6$ .................................................. H01L 29/00
[52] U.S. Cl. ......................... 257/532; 257/506; 257/508
[58] Field of Search ................................. 257/506, 508, 257/532

[56] References Cited

U.S. PATENT DOCUMENTS

| | | | |
|---|---|---|---|
| 4,924,290 | 5/1990 | Enkaku et al. | 357/68 |
| 5,185,650 | 2/1993 | Wakimoto et al. | 257/508 |
| 5,401,989 | 3/1995 | Kikuchi | 257/211 |

FOREIGN PATENT DOCUMENTS

| | | |
|---|---|---|
| 0 296 658 | 12/1988 | European Pat. Off. . |
| 81/00171 | 1/1981 | WIPO . |

OTHER PUBLICATIONS

IBM Technical Disclosure Bulleting, No. 7, Dec. 1987, Decoupling Capacitor Structure to Reduce Fet.
IEEE Transactions on Circuit and Systems, No. 7, Jul. 1978, Terminology Related to the Performance of S/H.
IEEE Publ. 36(1989) Jun., No. 6, 3pages, "Transactions on Circuits and Systems".
IEEE Publ. vol. 67, No. 1, Jan. 1979 (Brodersen et al), pp. 61–75, "MOS Switched–Capacitor Filters".
IBM Technical Disclosure Bulletin, vol. 30, No. 7, 1987, pp. 167–168.

*Primary Examiner*—David Ostrowski
*Attorney, Agent, or Firm*—Herbert L. Lerner; Laurence A. Greenberg

[57] ABSTRACT

An integrated semiconductor circuit, such as an A/D converter, includes a first zone having capacitors disposed therein. The capacitors have capacitor plates being formed of a first conductive layer and a second conductive layer. A second zone has circuit elements disposed therein. A planarizing layer and a cover layer insulate the first and second conductive layers from one another in the second zone, except for a possible peripheral region. A dielectric is formed only of the cover layer between the capacitor plates in the first zone, except for a possible peripheral region. A process for producing an integrated semiconductor circuit includes producing the first conductive layer; applying an insulating planarizing layer after producing the first conductive layer; removing the planarizing layer in the first zone until a surface of the first conductive layer is exposed, except for a possible peripheral region; applying an insulating cover layer over the entire surface; and producing the second conductive layer.

8 Claims, 3 Drawing Sheets

INTEGRATED SEMICONDUCTOR CIRCUIT WITH CAPACITORS OF PRECISELY DEFINED CAPACITANCE AND PROCESS FOR PRODUCING THE CIRCUIT

CROSS-REFERENCE TO RELATED APPLICATION

This application is a file wrapper continuation of application Ser. No. 08/363,284, filed on Dec. 22, 1994 now abandoned.

BACKGROUND OF THE INVENTION

Field of the Invention

The invention relates to an integrated semiconductor circuit, such as an A/D converter, including a first zone in which capacitors are disposed, the capacitors having capacitor plates being formed of a first conductive layer and a second conductive layer, and a second zone in which circuit elements are disposed. The invention also relates to a process for producing the circuit.

In many types of integrated semiconductor circuits, the problem of producing one or more capacitors with a very precisely defined capacitance plays a major role. The absolute value of the capacitance and/or the relative accuracy of the capacitance of the different capacitors can be essential.

One example thereof are A/D converters, which are typically made with the aid of capacitor networks. For that purpose, in 8-bit converters, for instance, the capacitors must have a relative accuracy of less than 200 ppm. That is necessary, since for unequivocal conversion of analog signals to digital signals or vice versa, there must be a monotonic relationship between the analog signal and the digital signal, or at least the non-monotony must be less than one bit (namely the least significant bit or LSB). The matching behavior of the circuit is determined, among other factors, by how well that requirement is met (see IEEE Transactions on Circuits and Systems, Vol. 25, No. 7, July 1978, p. 419).

In CMOS processes, for instance, suitable capacitances can be achieved in different planes, such as polysilicon to substrate, polysilicon 1 to metal 1, polysilicon 1 to polysilicon 2, or metal 1 to metal 2. In the polysilicon planes as capacitor plates, it must be taken into account that the dopings must be relatively high (approximately $10^{20}/cm^2$), if the necessary constancy is to be achieved upon a voltage change. Such high dopings cannot always meet the requirements of the overall process in terms of the gate polysilicon, or they necessitate an additional doping with a mask in the silicon substrate. If polysilicon and substrate are used for the capacitance, then because of the usually slight gate oxide thicknesses of modern CMOS generations, high specific capacitances are attained, which is deleterious to the recharging time. However, given sufficiently low structural tolerances of lithography and etching processes, adequately small capacitor surface areas (to increase the speed) can be produced with the necessary accuracy. At least in process options that have two polysilicon planes, it may be advantageous, in terms of those peripheral conditions, to produce the capacitances using one or both polysilicon planes.

If only one polysilicon plane is processed, then often a metal 1/metal 2 capacitance is more suitable. It is also successfully used in 0.7 $\mu$m CMOS generations, for 10-bit A/D converters with linearities of 0.5 LSB.

Particularly in future generations, the dielectric between the conductive layer, from which the capacitor plates are formed, must be planarized over a long range. For example, the typical planarizing lengths in the intermetal dielectric, when spin-on glass (SOG) planarizing techniques are employed, are from 10 to 100 $\mu$m. Given the typical dimensions of an A/D converter capacitor network of a few hundred micrometers, this leads to unacceptable fluctuations in the thickness of the capacitor dielectric. In 10-bit A/D converters, the planarizing with SOG already leads to errors in linearity of from 2 to 4 LSB, and therefore to massive yield losses because of the occurrence of what are known as missing codes.

SUMMARY OF THE INVENTION

It is accordingly an object of the invention to provide an integrated semiconductor circuit with capacitors of precisely defined capacitance and a process for producing the circuit, which overcome the hereinafore-mentioned disadvantages of the heretofore-known devices and processes of this general type and which improve an absolute or relative accuracy of the capacitance of one or more capacitors.

With the foregoing and other objects in view there is provided, in accordance with the invention, an integrated semiconductor circuit, comprising a first zone having capacitors disposed therein, the capacitors having capacitor plates being formed of a first conductive layer and a second conductive layer; a second zone having circuit elements disposed therein; a planarizing layer and a cover layer insulating the first and second conductive layers from one another in the second zone, except for a possible peripheral region; and a dielectric being formed only of the cover layer between the capacitor plates in the first zone, except for a possible peripheral region.

In accordance with another feature of the invention, the cover layer is formed of silicon oxide.

In accordance with a further feature of the invention, the conductive layers are formed of polysilicon, and the planarizing layer is formed of silicon oxide.

In accordance with an added feature of the invention, the first conductive layer is formed of polysilicon, the second conductive layer is formed of a material selected from the group consisting of metal and a metal alloy, and the planarizing layer is formed of a doped silicate glass.

In accordance with an additional feature of the invention, the conductive layers are formed of a material selected from the group consisting of metal and a metal alloy, and the planarizing layer is formed of silicon oxide and an auxiliary layer.

In accordance with yet another feature of the invention, the capacitors have a capacitance being adjusted by the thickness of the cover layer.

With the objects of the invention in view, there is also provided an A/D converter which is constructed according to the foregoing.

With the objects of the invention in view, there is additionally provided a process for producing an integrated semiconductor circuit including a first zone, capacitors being disposed in the first zone and having capacitor plates formed of a first conductive layer and a second conductive layer, a second zone, and circuit elements disposed in the second zone, which comprises producing the first conductive layer; applying an insulating planarizing layer after producing the first conductive layer; removing the planarizing layer in the first zone until a surface of the first conductive layer is exposed, except for a possible peripheral region; applying an insulating cover layer over the entire surface; and producing the second conductive layer.

In accordance with another mode of the invention, there is provided a production process which comprises carrying out the step of removing the planarizing layer with the aid of a photographic technique using a photomask having a separate window for each respective capacitor of the first zone.

In accordance with a concomitant mode of the invention, there is provided a production process which comprises carrying out the step of removing the planarizing layer with the aid of a photographic technique using a photomask having one continuous window for all of the capacitors of the first zone.

In the invention, the insulating layer between the two conductive layers includes a planarizing layer and a cover layer in the second zone, in which only circuit elements in which the requirement for accuracy of the capacitance is low are disposed in the second zone. In the first zone, in which one or more capacitors with a capacitance that must be adjusted precisely are disposed, the insulating layer between the capacitor plates includes only the cover layer.

In order to produce such a configuration, processes may be considered, in particular, in which in the first zone the planarizing layer above the first conductive layer is removed again entirely, optionally except for a peripheral region of the first zone, which depends upon the accuracy of adjustment. The thickness of the capacitor dielectric formed of the cover layer is accordingly very uniform and can be adjusted precisely. The matching behavior is decisively improved thereby, and if the construction rules change (such as a change in the capacitor surface area), the capacitance can be adapted very easily (by changing the thickness of the cover layer).

The proposed embodiment is also usable in other planarizing techniques besides SOG, such as planarizing by means of BPSG flow or lacquer planarization. Moreover, a possible memory effect from polarization of the planarizing layer, as can occur with SOG, for instance, is avoided.

In the invention, the capacitor dielectric is thinner than in conventional processes, but this is no problem for the speed of an A/D converter, for instance. The production of highly linear A/D converters (error of <1 LSB) with simultaneously optimal planarizing of the circuit, is made possible. The proposed embodiment is also suitable for high-resolution A/D converters.

Other features which are considered as characteristic for the invention are set forth in the appended claims.

Although the invention is illustrated and described herein as embodied in an integrated semiconductor circuit with capacitors of precisely defined capacitance and a process for producing the circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
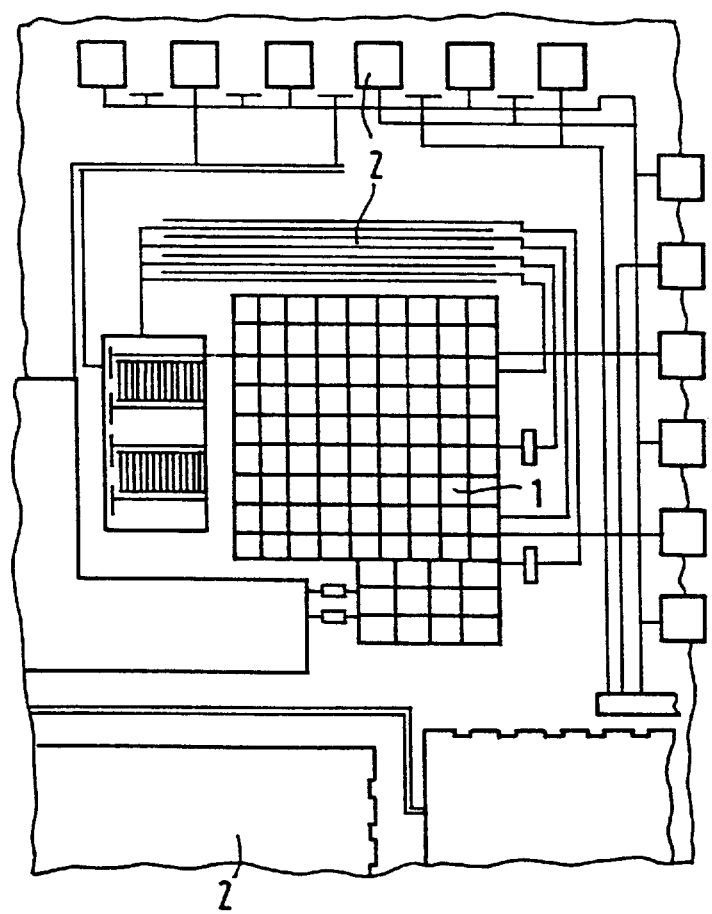
FIG. 1 is a fragmentary, diagrammatic, plan view of an A/D converter as an example of an integrated semiconductor circuit.

Referring now to the figures of the drawing in detail and first, particularly, to FIG. 1 thereof, there is seen a plan view of a portion of an A/D converter, having a first zone 1 in which capacitors are disposed having a capacitance that must be adjusted very precisely, for the reasons given above. Located outside the first zone is a second zone 2, in which various circuit elements, terminals and other elements, which are made by the CMOS technique, for instance, are located.

Figure 2:
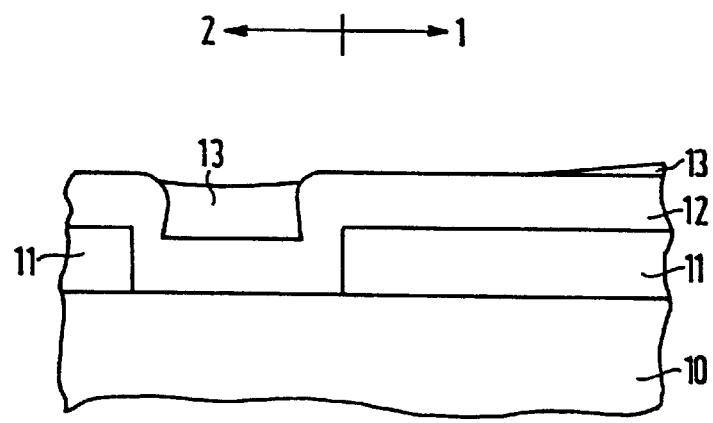
FIGS. 2, 3 and 4 are fragmentary, cross-sectional views of a semiconductor structure, in terms of which the essential method steps of one embodiment of the invention will be explained.

By referring to FIG. 2, the process of the invention is explained in terms of a process in which the capacitor is formed of two metal layers. In this figure, a boundary region of the first zone 1 and the second zone 2 is shown in a cross section through a semiconductor substrate 10. A first conductive layer 11 which is a structured metal layer, for instance an aluminum alloy, is located on the substrate 10. Naturally, other non-illustrated layers may be disposed between the substrate 10 and the first metal layer 11. In the first zone 1, the metal layer 11 serves as a first capacitor plate, while in the second zone 2, conductor tracks may be formed of the metal layer 11, for instance. The first metal layer 11 is covered with a planarizing layer 12, 13.

In this case, the planarizing layer is formed by a PECVD silicon oxide layer 12 and an SOG layer 13 located above it. After the SOG has been applied, a conventional etching back step is performed. The layer thicknesses may, for instance, be as follows: 700 nm of silicon oxide, 600 nm of SOG, and etching back of SOG: 770 nm. Further variations around these exemplary values are also possible. In particular, a much thinner oxide may be employed, and/or etching back of the SOG may be omitted. The planarizing may also be attained with an auxiliary layer other than SOG, and a single planarizing layer (without an auxiliary layer), such as an in-situ planarized oxide, may also be employed.

Figure 3:
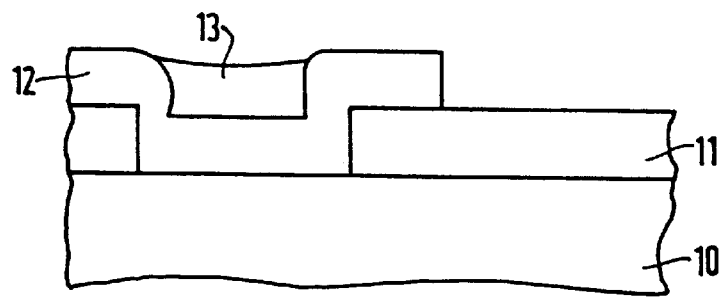

As is illustrated in FIG. 3, the planarizing layer in the first zone is then removed, for instance with the aid of a photo technique, until the first conductive layer 11 is exposed. Adjustment tolerances must be taken into account. In other words, the edge of the first planarizing layer 12, 13 is generally not precisely coincident with the boundary between the first and second zones. The edge lay error is typically a few tenths of a micrometer. In this case, the planarizing layer 12, 13 also protrudes into the peripheral region of the first zone 1. The edge of the planarizing layer may also be located in the peripheral region of the second zone 2. Care must be taken to ensure that no edge covering problems at the metal 1 edge arise in the ensuing process steps. The danger of short circuits in the metal 2 plane also exists, if residues remain at the step after the metal 2 etching has been done. In each case, the surface of the first conductive layer 11 is exposed virtually over the entire first zone. In the second zone, the planarizing which was achieved is maintained, since in this case the planarizing layer 12, 13 is not removed.

Figure 4:
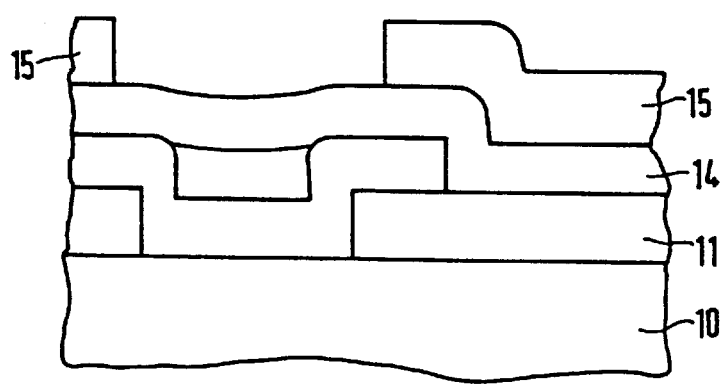

FIG. 4 shows that an insulating cover layer 14, in this case a PECVD silicon oxide of approximately 700 nm in thickness, is deposited over the entire surface area. Its layer thickness can be adjusted very constantly and accurately.

This cover layer 14 may be provided at suitable points in the second zone with non-illustrated contact holes leading to conductive planes located beneath. A second conductive layer 15 of an aluminum alloy that is approximately 1,000 nm thick, with a possible barrier layer, is applied and structured. A surface area of the capacitor is defined in the first zone by an overlap of the two conductive layers 11, 15. In the first zone, a dielectric between the conductive layers includes only the cover layer 14, except for the peripheral region produced by the edge lay error. This peripheral region does not measurably change the capacitance or contribute to the effective capacitance. In the second zone, the insulation between the two conductive layers 11, 15 is effected by the planarizing layer 12, 13 and by the cover layer 14 above it. Once again, as explained above, there is a possible restriction in the peripheral region of the second zone.

With a view toward the photographic technique, it may be advantageous in the embodiment described to apply a thin silicon oxide layer, for instance being 100 nm thick, after the etching back of the SOG and before a lacquer mask is applied. In this way, problems in lacquer application and lacquer stripping, as can arise when SOG is used, are avoided.

Advantageously, the lacquer mask for exposing the metal 1 surface is coincident with the structured first or second metal plane in the first zone, and in particular is coincident with the capacitance-determining, i.e. "smaller" metal plane. The lacquer mask can expose each capacitor individually, or the entire capacitor field. In the first case, a separate window is provided for each capacitor, so that for each capacitor a narrow peripheral region, which is determined by the adjustment tolerance and is part of the first (or second) zone exists, in which the planarizing layer is part of the dielectric. In the second case, the window extends continuously over the entire first zone, so that care must be taken to ensure that in the interior of the first zone no short circuits arise in the overlying metal 2 plane (that is, the danger of metal 2 residues after etching of the metal 2).

Figure 5A:
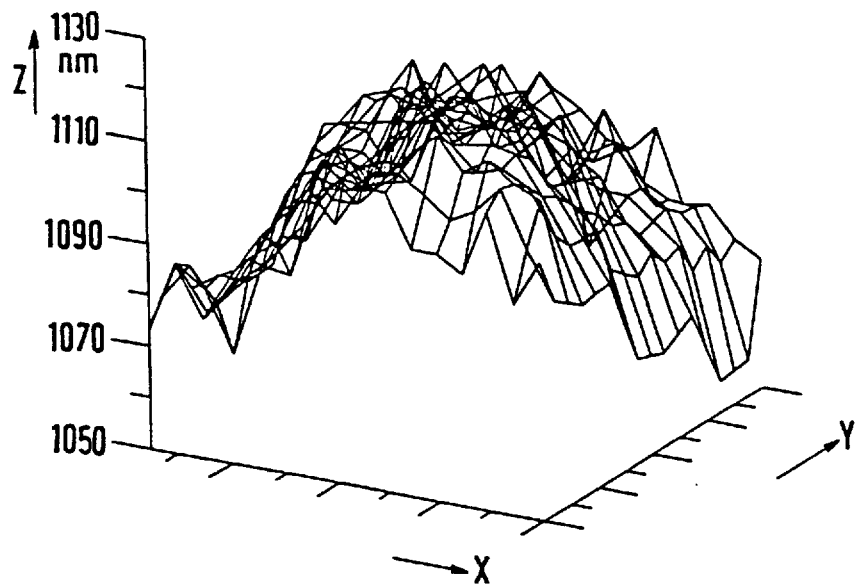
FIGS. 5a and 5b are diagrams showing measurements of a dielectric thickness across a capacitor field, wherein a dielectric in FIG. 5a was produced by a conventional process and a dielectric in FIG. 5b was produced by the process of the invention.
Figure 5B:
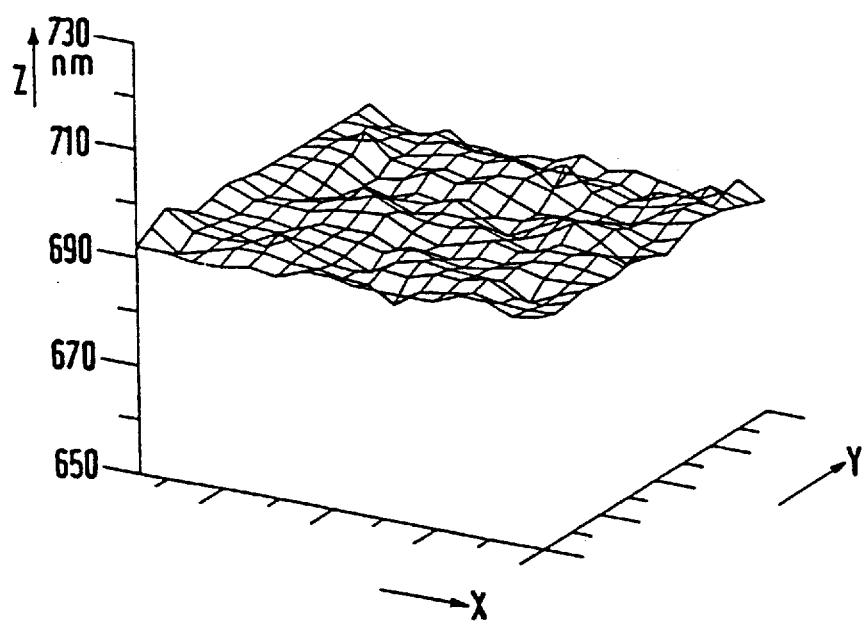

The diagrams in FIGS. 5a and 5b show the thickness of the capacitor dielectric (along the Z axis), as measured across a capacitor field (defined by the X/Y plane). FIG. 5a shows the results in a capacitor dielectric produced by a conventional process (with SOG planarization), and FIG. 5b shows the results after the process of the invention is carried out. In both cases, the interval between two portions along the scale on the Z axis is 10 nm, so that despite the differing command or set point value of the dielectric thickness, it is immediately apparent that with the process of the invention, a considerable improvement in uniformity is attained. In both measurements, the dielectric thickness was determined for every other capacitor and the area of a capacitor was 40×40 $\mu m^2$.

We claim:

1. An integrated semiconductor circuit, comprising;
   a first conductive layer;
   a second conductive layer disposed on said first conductive layer;
   said first conductive layer and said second conductive layer defining a first zone and a second zone;
   said first zone having a capacitor disposed therein, said capacitor having capacitor electrodes being formed of said first conductive layer and said second conductive layer;
   said second zone having circuit elements disposed therein;
   a planarizing layer disposed between said first conductive layer and said second conductive layer in said second zone and a cover layer directly covering said planarizing layer, said planarizing layer and said cover layer insulating said first conductive layer and said second conductive layer from one another in said second zone; and
   a dielectric being formed only of said cover layer between said capacitor electrodes in said first zone.

2. The integrated semiconductor circuit according to claim 1, wherein said planarizing layer and said cover layer insulate said first and second conductive layers from one another in said second zone, except for a peripheral region; and said dielectric is formed only of said cover layer between said capacitor plates in said first zone, except for a peripheral region.

3. The integrated semiconductor circuit according to claim 1, wherein said cover layer is formed of silicon oxide.

4. The integrated semiconductor circuit according to claim 1, wherein said conductive layers are formed of polysilicon, and said planarizing layer is formed of silicon oxide.

5. The integrated semiconductor circuit according to claim 1, wherein said first conductive layer is formed of polysilicon, said second conductive layer is formed of a material selected from the group consisting of metal and a metal alloy, and said planarizing layer is formed of a doped silicate glass.

6. The integrated semiconductor circuit according to claim 1, wherein said conductive layers are formed of a material selected from the group consisting of metal and a metal alloy, and said planarizing layer is formed of silicon oxide and a further layer.

7. The integrated semiconductor circuit according to claim 1, wherein said capacitors have a capacitance being adjusted by the thickness of said cover layer.

8. An A/D converter, comprising:
   a first conductive layer;
   a second conductive layer disposed on said first conductive layer;
   said first conductive layer and said second conductive layer defining a first zone and a second zone;
   said first zone having a capacitor disposed therein, said capacitor having capacitor electrodes being formed of said first conductive layer and said second conductive layer;
   said second zone having circuit elements disposed therein;
   a planarizing layer disposed between said first conductive layer and said second conductive layer in said second zone and a cover layer directly covering said planarizing layer, said planarizing layer and said cover layer insulating said first conductive layer and said second conductive layer from one another in said second zone; and
   a dielectric being formed only of said cover layer between said capacitor electrodes in said first zone.

* * * * *